(12) United States Patent
Park et al.

(10) Patent No.: US 8,999,825 B2
(45) Date of Patent: Apr. 7, 2015

(54) METHOD OF HEALING DEFECT AT JUNCTION OF SEMICONDUCTOR DEVICE USING GERMANIUM

(71) Applicants: Korea Advanced Nano Fab Center, Suwon, Gyeonggi-Do (KR); Sungkyunkwan University Research & Business Foundation, Suwon, Gyeonggi-Do (KR)

(72) Inventors: Won Kyu Park, Seoul (KR); Jong Gon Heo, Gyeonggi-Do (KR); Dong Hwan Jun, Gyeonggi-Do (KR); Jin Hong Park, Gyeonggi-Do (KR); Jae Woo Shim, Gyeonggi-Do (KR)

(73) Assignees: Korea Advanced Nano Fab Center, Suwon, Gyeonggi-Do (KR); Sungkyunkwan University Research & Business Foundation, Suwon, Gyeonggi-Do (KR)

( * ) Notice: Subject to any disclaimer, the term of this patent is extended or adjusted under 35 U.S.C. 154(b) by 16 days.

(21) Appl. No.: 14/086,320

(22) Filed: Nov. 21, 2013

(65) Prior Publication Data
US 2014/0187021 A1    Jul. 3, 2014

(30) Foreign Application Priority Data

Dec. 31, 2012 (KR) .................. 10-2012-0157977

(51) Int. Cl.
*H01L 21/265* (2006.01)
*H01L 21/322* (2006.01)

(52) U.S. Cl.
CPC .................. *H01L 21/3221* (2013.01)

(58) Field of Classification Search
CPC ....................................... H01L 21/324
USPC ........................... 438/510, 514, 530
See application file for complete search history.

(56) References Cited

U.S. PATENT DOCUMENTS

| 6,635,110 | B1* | 10/2003 | Luan et al. | 117/4 |
| 7,008,813 | B1* | 3/2006 | Lee et al. | 438/56 |
| 2006/0194415 | A1* | 8/2006 | Lee et al. | 438/459 |
| 2006/0267017 | A1* | 11/2006 | Noguchi et al. | 257/66 |

* cited by examiner

*Primary Examiner* — Bradley K Smith
(74) *Attorney, Agent, or Firm* — Locke Lord LLP; Christopher J. Capelli; Daniel J. Fiorello (57) ABSTRACT

This invention relates to a method of healing defects at junctions of a semiconductor device, which includes growing a p-Ge layer on a substrate, performing ion implantation on the p-Ge layer to form an n+ Ge region or performing in-situ doping on the p-Ge layer and then etching to form an n+ Ge region or depositing an oxide film on the p-Ge layer and performing patterning, etching and in-situ doping to form an n+ Ge layer, forming a capping oxide film, performing annealing at 600~700° C. for 1~3 hr, and depositing an electrode, and in which annealing enables Ge defects at n+/p junctions to be healed and the depth of junctions to be comparatively reduced, thus minimizing leakage current, thereby improving properties of the semiconductor device and achieving high integration and fineness of the semiconductor device.

12 Claims, 11 Drawing Sheets

METHOD OF HEALING DEFECT AT JUNCTION OF SEMICONDUCTOR DEVICE USING GERMANIUM

CROSS-REFERENCE TO RELATED APPLICATION

This application claims the benefit of Korean Patent Application No. 10-2012-0157977, filed Dec. 31, 2012, which is hereby incorporated by reference in its entirety into this application.

BACKGROUND OF THE INVENTION

1. Technical Field

The present invention relates to a method of healing defects at junctions of a semiconductor device, and more particularly, to a method of healing defects at junctions of a semiconductor device using germanium (Ge), wherein annealing is performed at 600~700° C. for 1~3 hr after formation of an n+ Ge region, thus healing defects at junctions of the semiconductor device.

2. Description of the Related Art

Field effect transistors using a silicon substrate control drain current via changes in the channel region depending on the magnitude of voltage applied to a gate, and are manufactured by defining an oxide film or a photoresist using photolithography to form a p-type well and an n-type source or an n-type drain and then determining the implantation depth or concentration by energy of a dopant to be implanted.

Semiconductors such as field effect transistors have conductive regions having different conductive types such as p-type and n-type on the silicon substrate, and such conductive regions essentially contain junctions. Upon manufacturing semiconductor devices, thorough research into minimizing defects at junctions thereof is ongoing to overcome defects of fine semiconductor devices.

Conventional semiconductors essentially involve an ion doping process, and defects at junctions having different conductive types are obstacles to improving properties of fine semiconductor devices depending on increases in the speed and degree of integration of the devices.

Thus, healing defects at junctions of the semiconductor device is regarded as very important to improve properties of semiconductor devices having high integration and fineness.

Conventional techniques include Korean Patent No. 10-0403992, entitled "Method of manufacturing semiconductor device," Korean Patent Application Publication No. 2001-0068316, entitled "Method of manufacturing MOS transistor," etc.

However, such conventional techniques do not disclose any specific method for healing defects at junctions, and also most other techniques do not show any special interest therein.

Furthermore, techniques disclosed to heal defects do not specify the temperature ranges and vaguely describe them in terms of annealing at high temperature. So, reliable methods able to heal defects have not yet been introduced.

Moreover, upon annealing at high temperature, there exists a probability of degradation because leakage current occurs due to deepened junctions. In particular, as the degree of integration of the semiconductor device increases, properties of the device may be prevented from deteriorating owing to a short channel effect only when the depth of junctions in a source-drain region is reduced. Hence, this problem should be overcome to improve properties of fine semiconductor devices.

SUMMARY OF THE INVENTION

Accordingly, the present invention has been made keeping in mind the above problems encountered in the related art, and an object of the present invention is to provide a method of healing defects at junctions of a semiconductor device using germanium, wherein annealing may be performed at 600~700° C. for 1~3 hr after formation of an n+ Ge region, so that defects at junctions of the semiconductor device may be healed.

Another object of the present invention is to provide a method of healing defects at junctions of a semiconductor device using germanium, wherein, in order to reduce the depth of junctions, germanide may be formed via annealing after formation of an electrode, thus minimizing leakage current.

In order to accomplish the above objects, an embodiment of the present invention provides a method of healing defects at junctions of a semiconductor device using germanium, including 1) growing a p-Ge layer on a substrate; 2) depositing an oxide film on the p-Ge layer, and patterning the oxide film, thus forming a pattern for an n+ Ge region; 3) subjecting the pattern for an n+ Ge region to ion implantation using a n-type dopant, thus forming the n+ Ge region; 4) forming a capping oxide film on the p-Ge layer; 5) performing annealing at 600~700° C. for 1~3 hr; and 6) subjecting the capping oxide film to patterning for forming an electrode, and depositing the electrode.

In addition, an embodiment of the present invention provides a method of healing defects at junctions of a semiconductor device using germanium, including 1) growing a p-Ge layer on a substrate; 2) performing in-situ doping using a n-type dopant on the p-Ge layer, thus forming an n+ Ge layer; 3) performing patterning for forming an n+ Ge region and etching, thus forming an n+ Ge region; 4) forming a capping oxide film on the p-Ge layer; 5) performing annealing at 600~700° C. for 1~3 hr; and 6) subjecting the capping oxide film to patterning for forming an electrode, and depositing the electrode.

In addition, an embodiment of the present invention provides a method of healing defects at junctions of a semiconductor device using germanium, including 1) growing a p-Ge layer on a substrate; 2) depositing an oxide film on the p-Ge layer, performing patterning for forming an n+ Ge region, and etching the oxide film or the oxide film and the p-Ge layer; 3) performing in-situ doping using a n-type dopant on the p-Ge layer for forming an n+ Ge region, thus forming an n+Ge layer; 4) forming a capping oxide film on the oxide film;

5) performing annealing at 600~700° C. for 1~3 hr; and 6) subjecting the capping oxide film to patterning for forming an electrode, and depositing the electrode.

The p-Ge layer in 1) is preferably formed by growing Ge to a thickness of 300~500 nm on a silicon (Si) substrate at 350~450° C. and 7.5~8.5 Pa, performing annealing at 800~850° C. for 20 min~1 hr in an $H_2$ atmosphere, repeating the preceding once more, and additionally growing a Ge layer at 550~650° C. and 7.5~8.5 Pa.

Also, the electrode in 6) preferably includes any one selected from among Ti, Ni, Pd, Pt, Ta, Cu, W, Co, Zr, Cr, Mn and Mo, and in order to reduce the depth of junctions via annealing, after formation of the electrode, annealing is preferably performed at 400~500° C. for 30 sec~2 min in an $N_2$ atmosphere, thus forming a germanide layer.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

The present invention addresses a method of healing defects at junctions of a semiconductor device, by performing annealing, in particular, annealing at 600~700° C. for 1~3 hr after formation of an n+ Ge region.

Hereinafter, a detailed description will be given of the present invention with reference to the appended drawings.

FIGS. 1, 2 and 3A and 3B schematically illustrate three kinds of processes according to the present invention, and FIGS. 4A to 4D schematically illustrate formation of an electrode using the above processes.

The present invention is embodied by three kinds of processes.

Figure 1:
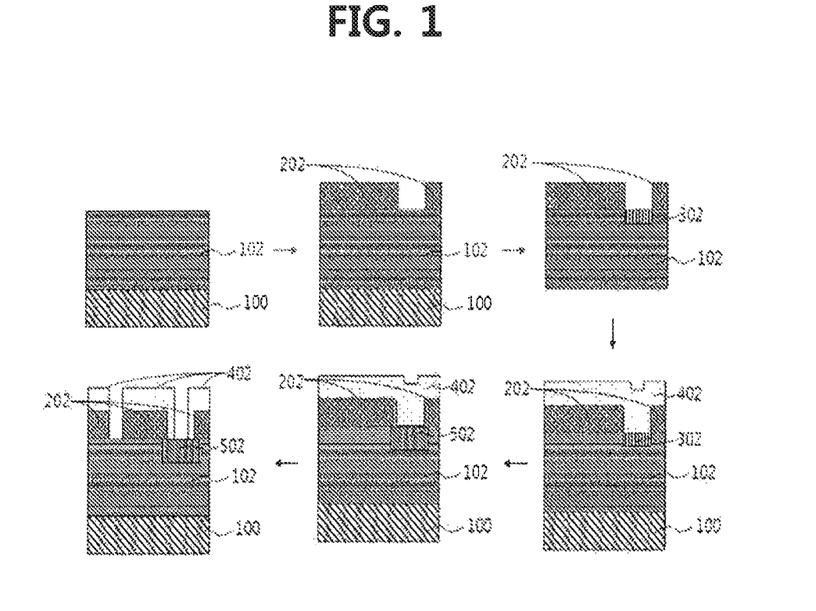
FIGS. 1, 2 and 3A and 3B schematically illustrate three kinds of processes according to the present invention.
Figure 4A:
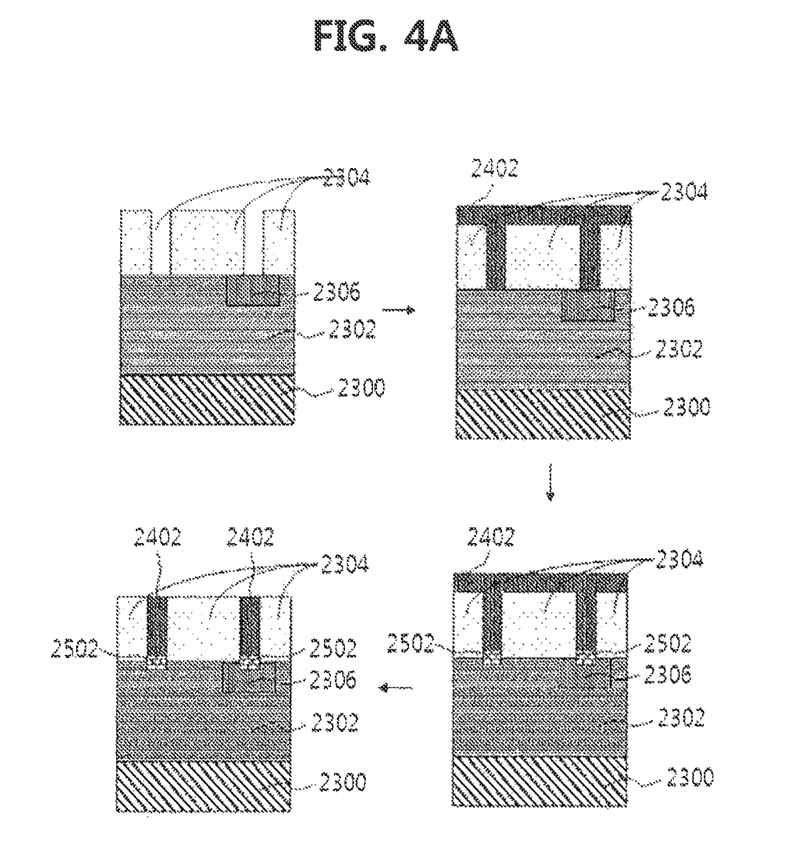
FIGS. 4A to 4D schematically illustrate formation of an electrode using the above processes.

Specifically, as illustrated in FIGS. 1 and 4A, Process 1 includes: 1) growing a p-Ge layer 102 on a substrate 100; 2) depositing an oxide film 202 on the p-Ge layer 102 and patterning the oxide film, thus forming a pattern for an n+ Ge region 302; 3) subjecting the pattern for an n+ Ge region 302 to ion implantation using a n-type dopant, thus forming an n+ Ge region 302; 4) forming a capping oxide film 402 on the p-Ge layer 102; 5) performing annealing at 600~700° C. for 1~3 hr; and 6) subjecting the capping oxide film 402 to patterning for forming an electrode 2402, and depositing the electrode 2402.

Herein, the substrate 100 is formed of silicon (Si) or silicon germanium (SiGe).

The p-Ge layer 102 is grown on the substrate. Upon growing the Ge layer, there is no need to dope an n-type dopant, or any specific doping may not be carried out because p-Ge properties may exhibit even when using only intrinsic Ge (i-Ge). The growth of the p-Ge layer does not limit the kind of deposition process, and is performed by known physical or chemical vacuum deposition processes.

The p-Ge layer, in particular, the p-Ge layer in 1), is preferably formed by growing Ge to a thickness of 300~500 nm on a Si substrate at 350~450° C. and 7.5~8.5 Pa, performing annealing at 800~850° C. for 20 min~1 hr in an $H_2$ atmosphere, repeating the preceding once more, additionally growing a Ge layer at 550~650° C. and 7.5~8.5 Pa and then performing annealing at 700~800° C. for 10~20 min in an $H_2$ atmosphere. This is to minimize defects at the interface of the Si substrate and the p-Ge layer and inside the p-Ge layer.

After growth of the p-Ge layer 102, the oxide film 202 is deposited on the p-Ge layer 102 and then patterned, thus forming the pattern for an n+ Ge region 302. The oxide film 202 is mainly formed of $SiO_2$, and the pattering process is carried out via a known process such as etching or photolithography by means of a reactive ion etcher (RIE) using a typical etching gas.

The pattern for an n+ Ge region 302 is subjected to ion implantation using a n-type dopant such as P, As or Sb, thus forming the n+ Ge region 302, after which the capping oxide film 402 is formed to prevent dopant loss and out-diffusion in the course of annealing.

After formation of the capping oxide film 402, annealing is performed at 600~700° C. for 1~3 hr. Specifically, the n+ Ge region formed via ion implantation is activated, and annealing is conducted at 600~700° C. for 1~3 hr in an $N_2$ atmosphere to heal defects.

Generally, because diffusion of a dopant occurs in the course of annealing, when activation is performed at low temperature, defects remaining in Ge may cause performance of the device to deteriorate. Hence, in order to minimize defects, annealing is performed at a high temperature of 600° C. or more, and preferably 600~700° C. for 1~3 hr. Thereby, an n+ Ge region 502 in which the defects have been healed is formed.

After annealing, as illustrated in FIG. 4A, the capping oxide film 402 is subjected to patterning for forming an electrode 2402, and the electrode 2402 is deposited. The electrode 2402 is formed of a metal, and preferably useful is any one selected from among Ti, Ni, Pd, Pt, Ta, Cu, W, Co, Zr, Cr, Mn and Mo. The electrode is deposited using a physical or chemical vacuum deposition process such as CVD. The deposited electrode is patterned in the same manner as in the oxide film.

After deposition of the electrode 2402, annealing is performed, thereby forming a germanide 2502. In order to minimize defects in Ge, the germanide 2502 is formed by performing annealing at a high temperature and preferably 400~500° C. for 30 sec~2 min in an $N_2$ atmosphere.

The formation of the germanide 2502 minimizes defects in Ge, and compensates for the deepened junctions resulting from annealing at high temperature. When the germanide 2502 is formed in this way, a material having low resistivity is placed in the deepened junctions, and thus the depth of the junctions is comparatively decreased.

Figure 2:
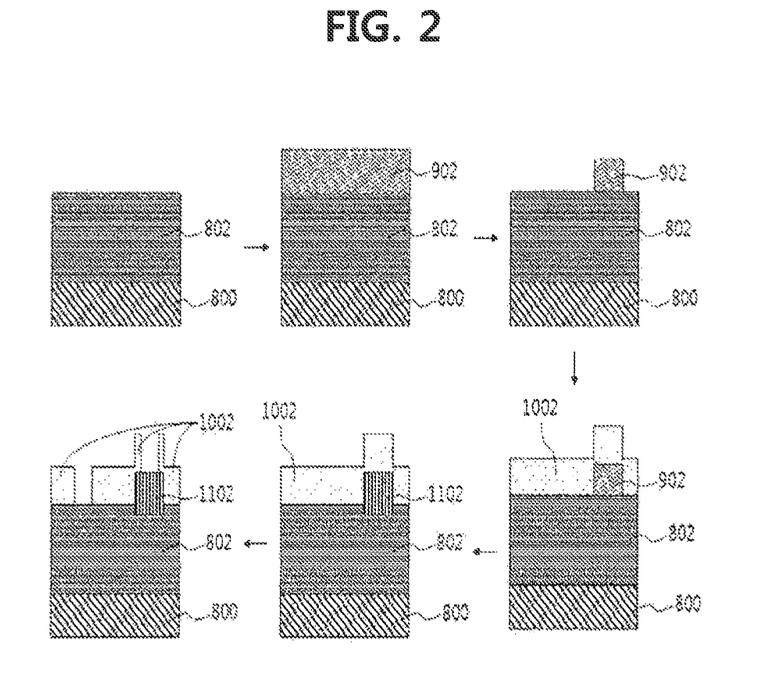
Figure 4B:
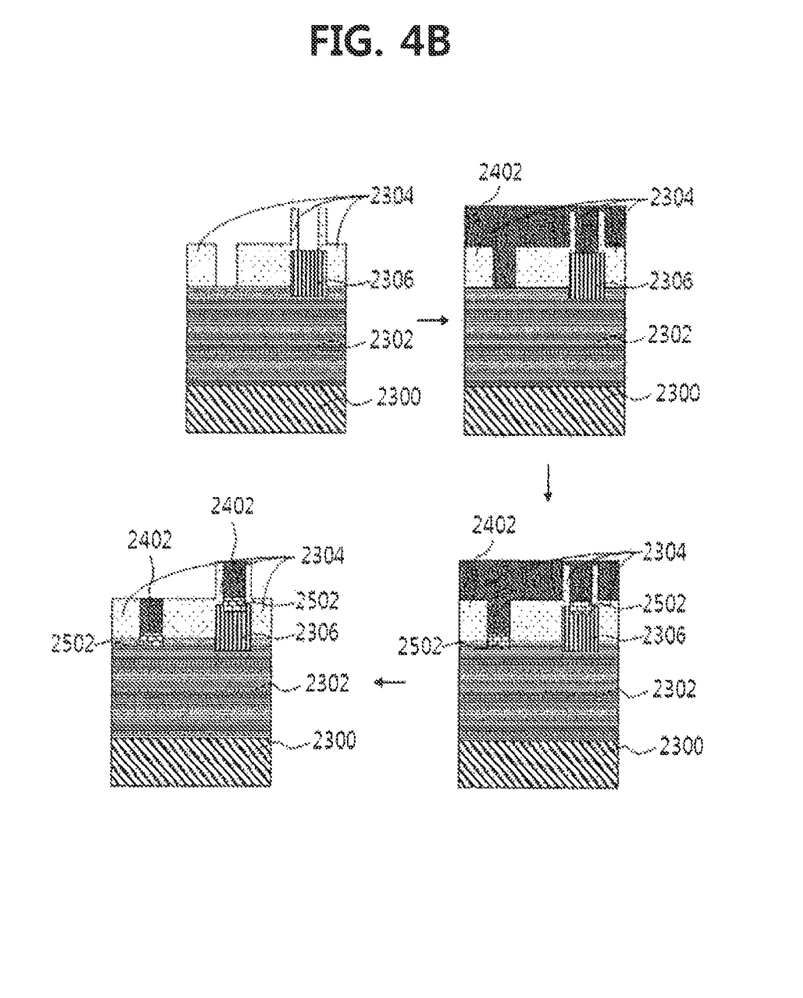

As illustrated in FIGS. 2 and 4B, Process 2 includes: 1) growing a p-Ge layer 802 on a substrate 800; 2) performing in-situ doping using a n-type dopant on the p-Ge layer 802, thus forming an n+ Ge layer; 3) performing patterning for forming an n+ Ge region and then etching, thus forming an n+ Ge region 902; 4) forming a capping oxide film 1002 on the p-Ge layer 802; 5) performing annealing at 600~700° C. for 1~3 hr, thus obtaining an n+ Ge region 1102 in which defects have been healed; and 6) subjecting the capping oxide film to patterning for forming an electrode 2402 and then depositing the electrode, as illustrated in FIG. 4B.

Although Process 2 is approximately similar to Process 1, the p-Ge layer 802 is grown on the substrate 800 in 1), after which the n+ Ge layer is formed via in-situ doping using a n-type dopant on the p-Ge layer 802, and patterning using a photoresist for forming an n+ Ge region and then etching are performed, thus forming the n+ Ge region 902.

The formation of the capping oxide film 1002, annealing, the formation of the electrode 2402 and the formation of the germanide 2502 remain the same as in Process 1.

Figure 3A:
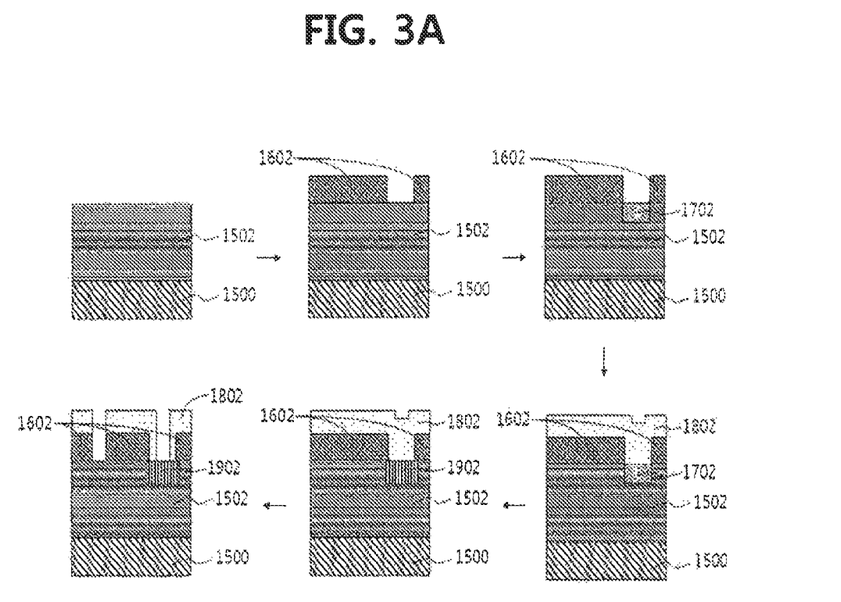
Figure 3B:
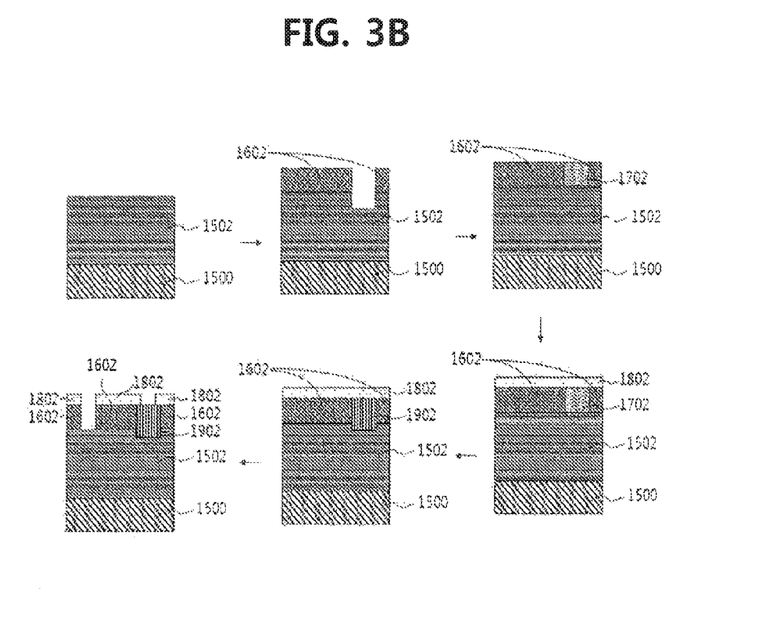
Figure 4C:
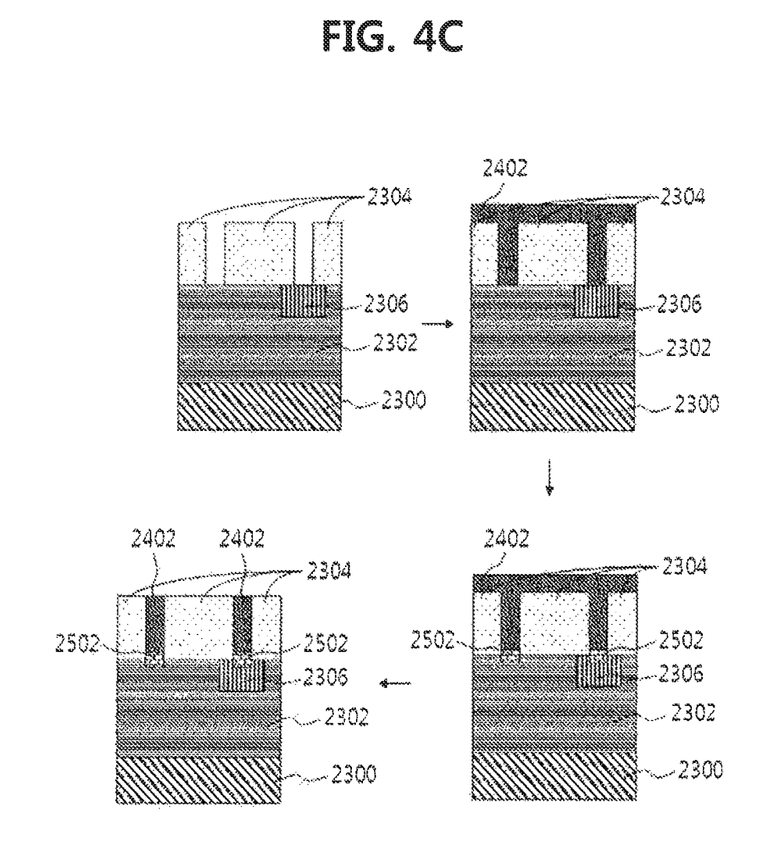
Figure 4D:
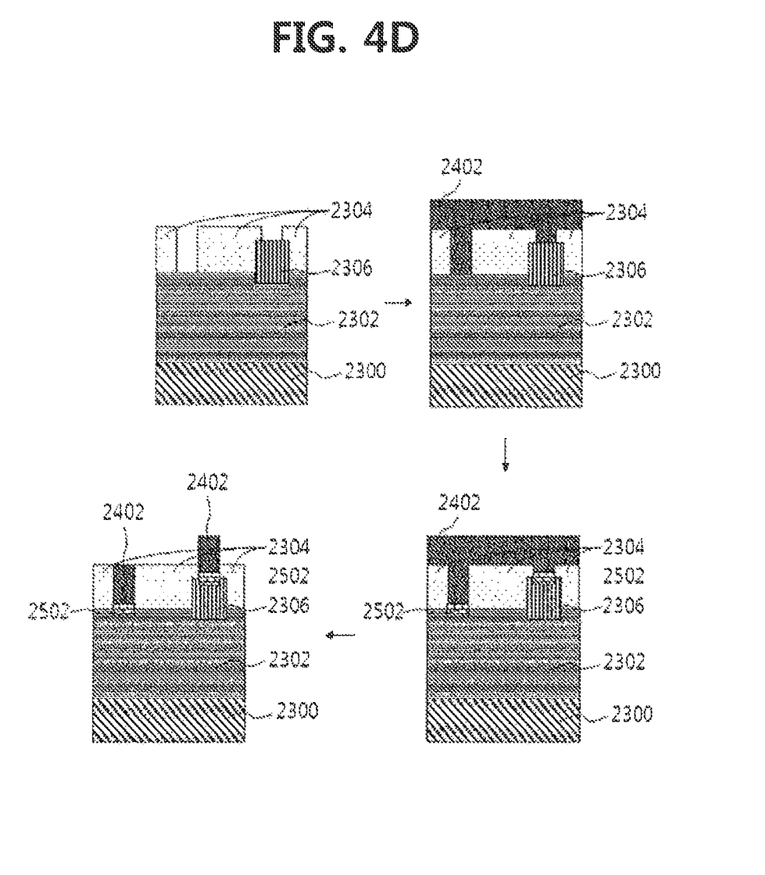

As illustrated in FIGS. 3A, 3B, 4C and 4D, Process 3 includes: 1) growing a p-Ge layer 1502 on a substrate 1500; 2) depositing an oxide film 1602 on the p-Ge layer 1502, performing patterning for forming an n+ Ge region and then etching the oxide film 1602 (FIG. 3A) or the oxide film 1602 and the p-Ge layer 1502 (FIG. 3B); 3) performing in-situ doping using a n-type dopant on the p-Ge layer 1502 for forming an n+ Ge region, thus forming an n+ Ge layer 1702; 4) forming a capping oxide film 1802 on the oxide film 1602; 5) performing annealing at 600~700° C. for 1~3 hr; and 6) subjecting the capping oxide film 1802 to patterning for forming an electrode 2402, and depositing the electrode 2402, as illustrated in FIG. 4C or 4D.

Although Process 1 is approximately similar to Process 1, the p-Ge layer 1502 is grown on the substrate 1500 in 1), after which the oxide film is deposited on the p-Ge layer 1502, patterning for forming an n+ Ge region 1702 is performed, the oxide film 1602 and the p-Ge layer 1502 are subjected to deep etching, and then in-situ doping using a n-type dopant is performed on the p-Ge layer 1502 for forming an n+ Ge region 1702, thus forming the n+ Ge layer. The formation of the capping oxide film 1802, annealing, the formation of the electrode 2402 and the formation of the germanide 2502 remain the same as in Process 1.

FIGS. 4A to 4D illustrates all of Process 1 (FIG. 1-FIG. 4A), Process 2 (FIG. 2~FIG. 4B), and Process 3 (FIG. 3A-FIG. 4C, FIG. 3B~FIG. 4D), in which in the device having the n+ Ge region 502, 1102, 1902 in which defects have been healed via annealing, the capping oxide film 402, 1002, 1802 is patterned, and the electrode 2402 is formed. Furthermore, these drawings depict the substrate 2300, the p-Ge layer 2302, the oxide film 2304, the n+ Ge region 2306, the electrode 2402 and the germanide 2502 in the electrode formation process.

As mentioned above, the method of healing defects at junctions of the semiconductor device using germanium according to the present invention is carried out by three kinds of processes, in which Process 1 includes forming n+/p junctions via ion implantation, Process 2 includes forming an n+ Ge layer via in-situ doping and forming n+/p junctions via selective etching of the n+ Ge layer, and Process 3 includes forming an n+ Ge layer via in-situ doping and forming n+/p junctions via etching of an oxide film and deep etching of a p-Ge layer.

Moreover, in order to reduce the depth of the n+/p junctions formed via ion implantation or in-situ doping, the germanide is formed via annealing upon forming the electrode.

All of the steps of respective processes generate defects in the course of forming junctions, but may sufficiently heal the defects via annealing, and thus the configuration of the semiconductor device adapted for each process is selected.

Thereby, according to the present invention, Ge defects at n+/p junctions may be healed, and the depth of the junctions may be comparatively reduced via annealing, thus minimizing leakage current, ultimately improving properties of the semiconductor device and achieving high integration and fineness of the semiconductor device.

Below is a description of the method according to embodiments of the present invention, in which portions which are not described depend on typical process methods.

Specifically in Process 1, Ge is grown to a thickness of 400 nm on a Si substrate at 400° C. and 8 Pa and then annealing is performed at 825° C. for 30 min in an $H_2$ atmosphere. The preceding is repeated once more, after which a Ge layer is additionally grown at 600° C. and 8 Pa and annealing is performed at 750° C. for 15 min in an $H_2$ atmosphere, thus forming a p-Ge layer on the Si substrate. Further, an oxide film made of $SiO_2$ is deposited using CVD and then patterned, after which P (phosphorus) is subjected to ion implantation at a dose of $10^{15}$ cm$^{-2}$ using an energy of 50 keV.

A capping oxide film made of $SiO_2$ which is the same as the above oxide film is deposited and then patterned via photolithography or ion etching, followed by performing annealing at 600° C. for 1 hr.

After annealing, a germanide is formed in such a manner that Ti is deposited to a thickness of 500 nm or more using CVD or e-beam evaporation, and annealing is performed at 450° C. for 1 min in an $N_2$ atmosphere because Ti begins to be diffused at 300° C. or more and germanide is initiated to be formed at about 450° C.

Next, Process 2 is similar to Process 1, and in steps 2) and 3), 1% phosphine ($PH_3$) is in-situ grown together with $GeH_4$ at 600° C. under a pressure of 8 Pa for 1 min, thus forming an n+ Ge layer. Subsequently, a photoresist is applied using spin coating, and then patterned using photolithography, after which Ge is etched for 60 sec using $NH_4OH$, $H_2O_2$ and $H_2O$ at 1:1:7, and the photoresist is removed, thereby forming an n+ Ge region.

Next, Process 3 is similar to Process 1, and in steps 2) and 3), an oxide film and a p-Ge layer are etched using $NH_4OH$, $H_2O_2$ and $H_2O$ at 1:1:7 for 100 sec, and 1% phosphine ($PH_3$) is in-situ grown together with $GeH_4$ at 600° C. under a pressure of 8 Pa for 1 min, thus forming an n+ Ge layer.

The test data for the semiconductor device formed by Process 1 among the above embodiments and the effects thereof are shown below.

Figure 5:
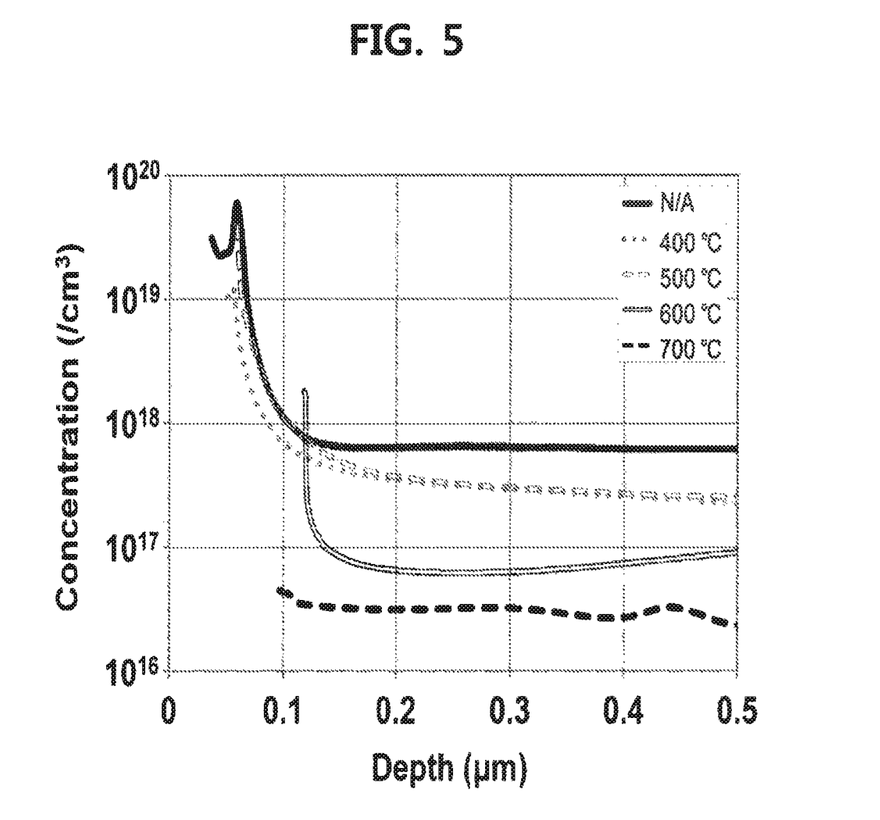
FIG. 5 illustrates the results of analysis of ECV depending on the annealing temperature after intentional formation of point defects following Ge ion implantation on a p-Ge layer.

FIG. 5 illustrates the results of analysis of ECV depending on the annealing temperature after intentional formation of point defects by implanting Ge ions on the p-Ge layer. Because point defects (vacancies) in Ge act as acceptor-like traps, a p-type concentration is increased. Thus, as is apparent from the results of ECV, the sample not subjected to annealing has a high p-type concentration. The higher the annealing temperature, the lower the p-type concentration, from which defects are considered to be healed. Accordingly, annealing at higher temperature can be seen to reduce point defects in Ge.

Figure 6:
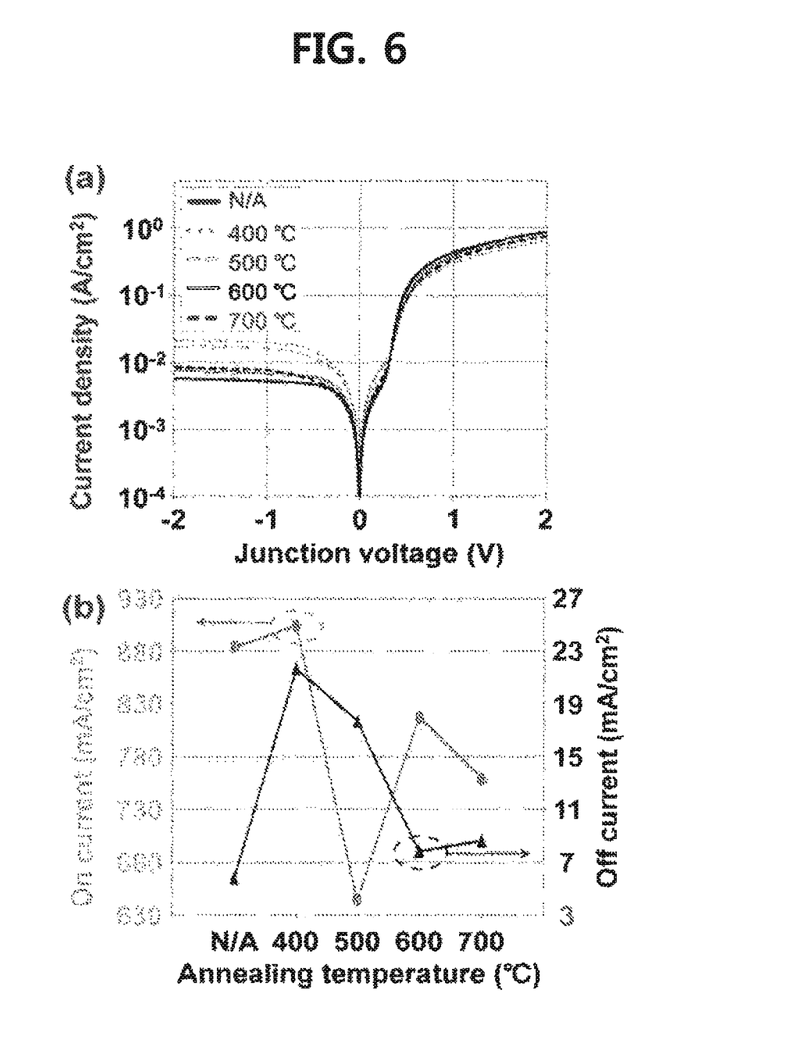
FIGS. 6A and 6B illustrate I-V graphs depending on the annealing temperature of Ge n+/p junctions.

FIGS. 6A and 6B illustrate I-V graphs depending on the annealing temperature of Ge n+/p junctions. When annealing is performed at low temperature (400~500° C.), off-current is increased due to an increase in point defects. However, when annealing is performed at high temperature (600~700° C.), off-current is lowered to a level similar to that of the sample not subjected to annealing. Thus, when the Ge device is exposed to high temperature, the device degrades, but annealing at 600° C. or higher sufficiently heals point defects. Thereby, even when the device is further exposed to high temperature in the subsequent processes (including metal electrode deposition using CVD, etc.), the degradation thereof may be prevented.

Figure 7:
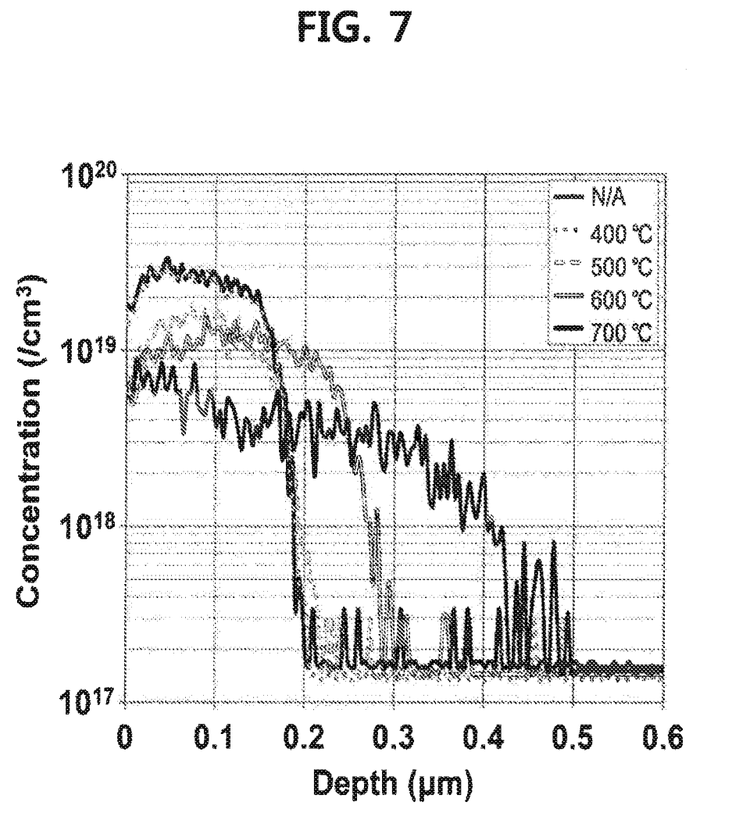
FIG. 7 illustrates the results of SIMS depending on the annealing temperature of Ge n+/p junctions.

FIG. 7 illustrates the results of SIMS depending on the annealing temperature of Ge n+/p junctions, in which almost of P is not diffused up to 500° C., and P is diffused to about 100 nm at 600° C. and to 200 nm or more at 700° C. Because diffusivity of P is remarkably increased from 700° C. or higher, the depth of junctions is greatly increased. Accordingly, as is apparent from the above test results, annealing at 600° C. for 1~3 hr is regarded as the most appropriate.

As described hereinbefore, the present invention provides a method of healing defects at junctions of a semiconductor device. According to the present invention, defects are generated in the course of forming junctions of a semiconductor device, but Ge defects at n+/p junctions can be healed via annealing, and the depth of junctions can be comparatively reduced via annealing, thus minimizing leakage current, thereby improving properties of the semiconductor device and effectively achieving high integration and fineness of the semiconductor device.

Also, according to the present invention, defects at junctions of the semiconductor device can be minimized upon fabrication of the semiconductor device, and thus the method of the invention has active applications in various industrial fields for increasing the integration and fineness of the semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of healing a defect at a junction of a semiconductor device using germanium (Ge), comprising:
   1) growing a p-Ge layer on a substrate;
   2) depositing an oxide film on the p-Ge layer, and patterning the oxide film, thus forming a pattern for an n+ Ge region;
   3) subjecting the pattern for an n+ Ge region to ion implantation using a n-type dopant, thus forming an n+ Ge region;
   4) forming a capping oxide film on the p-Ge layer;
   5) performing annealing at 600~700° C. for 1~3 hr; and
   6) subjecting the capping oxide film to patterning for forming an electrode, depositing the electrode, and performing annealing.

2. The method of claim 1, wherein the p-Ge layer in 1) is formed by growing Ge to a thickness of 300~500 nm on a silicon (Si) substrate at 350~450° C. and 7.5~8.5 Pa, performing annealing at 800~850° C. for 20 min~1 hr in an $H_2$ atmosphere, repeating the preceding once more, additionally growing a Ge layer at 550~650° C. and 7.5~8.5 Pa, and performing annealing at 700~800° C. for 10~20 min in an $H_2$ atmosphere.

3. The method of claim 1, wherein the electrode in 6) comprises any one selected from among Ti, Ni, Pd, Pt, Ta, Cu, W, Co, Zr, Cr, Mn and Mo.

4. The method of claim 1, wherein, after depositing the electrode in 6), annealing is performed at 400~500° C. for 30 sec~2 min in an $N_2$ atmosphere, thus forming a germanide layer.

5. A method of healing a defect at a junction of a semiconductor device using germanium (Ge), comprising:
   1) growing a p-Ge layer on a substrate;
   2) performing in-situ doping using a n-type dopant on the p-Ge layer, thus forming an n+ Ge layer;
   3) performing patterning for forming an n+ Ge region and etching, thus forming an n+ Ge region;
   4) forming a capping oxide film on the p-Ge layer;
   5) performing annealing at 600~700° C. for 1~3 hr; and
   6) subjecting the capping oxide film to patterning for forming an electrode, depositing the electrode, and performing annealing.

6. The method of claim 5, wherein the p-Ge layer in 1) is formed by growing Ge to a thickness of 300~500 nm on a silicon (Si) substrate at 350~450° C. and 7.5~8.5 Pa, performing annealing at 800~850° C. for 20 min~1 hr in an $H_2$ atmosphere, repeating the preceding once more, additionally growing a Ge layer at 550~650° C. and 7.5~8.5 Pa, and performing annealing at 700~800° C. for 10~20 min in an $H_2$ atmosphere.

7. The method of claim 5, wherein the electrode in 6) comprises any one selected from among Ti, Ni, Pd, Pt, Ta, Cu, W, Co, Zr, Cr, Mn and Mo.

8. The method of claim 5, wherein, after depositing the electrode in 6), annealing is performed at 400~500° C. for 30 sec~2 min in an $N_2$ atmosphere, thus forming a germanide layer.

9. A method of healing a defect at a junction of a semiconductor device using germanium (Ge), comprising:
   1) growing a p-Ge layer on a substrate;
   2) depositing an oxide film on the p-Ge layer, performing patterning for forming an n+ Ge region, and etching the oxide film or the oxide film and the p-Ge layer;
   3) performing in-situ doping using a n-type dopant on the p-Ge layer for forming an n+ Ge region, thus forming an n+ Ge layer;
   4) forming a capping oxide film on the oxide film;
   5) performing annealing at 600~700° C. for 1~3 hr; and
   6) subjecting the capping oxide film to patterning for forming an electrode, depositing the electrode, and performing annealing.

10. The method of claim 9, wherein the p-Ge layer in 1) is formed by growing Ge to a thickness of 300~500 nm on a silicon (Si) substrate at 350~450° C. and 7.5~8.5 Pa, performing annealing at 800~850° C. for 20 min~1 hr in an $H_2$ atmosphere, repeating the preceding once more, additionally growing a Ge layer at 550~650° C. and 7.5~8.5 Pa, and performing annealing at 700~800° C. for 10~20 min in an $H_2$ atmosphere.

11. The method of claim 9, wherein the electrode in 6) comprises any one selected from among Ti, Ni, Pd, Pt, Ta, Cu, W, Co, Zr, Cr, Mn and Mo.

12. The method of claim 9, wherein, after depositing the electrode in 6), annealing is performed at 400~500° C. for 30 sec~2 min in an $N_2$ atmosphere, thus forming a germanide layer.

* * * * *